(12) United States Patent
Hasegawa et al.

(10) Patent No.: US 6,256,371 B1
(45) Date of Patent: Jul. 3, 2001

(54) X-RAY ILLUMINATION DEVICE, X-RAY ILLUMINATION METHOD, AND AN X-RAY EXPOSING DEVICE AND DEVICE MANUFACTURING METHOD USING THE SAME

(75) Inventors: Takayuki Hasegawa, Utsunomiya; Yutaka Watanabe, Shioya-gun, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/207,023

(22) Filed: Dec. 8, 1998

(30) Foreign Application Priority Data

Dec. 10, 1997 (JP) .................................................. 9-340055
Nov. 10, 1998 (JP) ................................................. 10-319002

(51) Int. Cl.$^7$ .................................................. H01L 21/30
(52) U.S. Cl. .............................................. 378/34; 378/145
(58) Field of Search ........................... 378/34–35, 84–85, 378/43, 145–146, 150–151, 205; 250/385.1, 374

(56) References Cited

U.S. PATENT DOCUMENTS

| | | | |
|---|---|---|---|
| 4,803,368 | * | 2/1989 | Barthelmes . |
| 5,276,725 | * | 1/1994 | Kawakami et al. ................... 378/34 |
| 5,285,488 | | 2/1994 | Watanabe et al. . |
| 5,394,451 | | 2/1995 | Miyake et al. . |
| 5,448,612 | | 9/1995 | Kasumi et al. . |
| 5,835,560 | | 11/1998 | Amemiya et al. . |
| 6,081,581 | * | 6/2000 | Hasegawa ............................ 378/145 |

* cited by examiner

*Primary Examiner*—David P. Porta
(74) *Attorney, Agent, or Firm*—Fitzpatrick, Cella, Harper & Scinto

(57) ABSTRACT

An x-ray illumination device which illuminates an object by reflecting an x-ray irradiated from a SR emission point with at least one x-ray mirror comprises: first measuring means for measuring the position of the emission point; first control means for controlling the position of the emission point based on the measurements of the first measuring means; second measuring means for measuring the position of the x-ray near the x-ray mirror; and second control means for controlling the position or the attitude of the x-ray mirror based on the measurements of the second measuring means. The control frequency of the first control means of the x-ray illumination device here is of a frequency range higher than the control frequency of the second control means, and the ranges of the two control frequencies thereof partially overlap.

13 Claims, 6 Drawing Sheets

X-RAY ILLUMINATION DEVICE, X-RAY ILLUMINATION METHOD, AND AN X-RAY EXPOSING DEVICE AND DEVICE MANUFACTURING METHOD USING THE SAME

BACKGROUND OF THE INVENTION

1. Field of the Invention

The present invention relates to an x-ray illumination device and method using synchrotron radiation or the like and also to an x-ray exposing device and device manufacturing method.

2. Description of the Related Art

Figure 6:
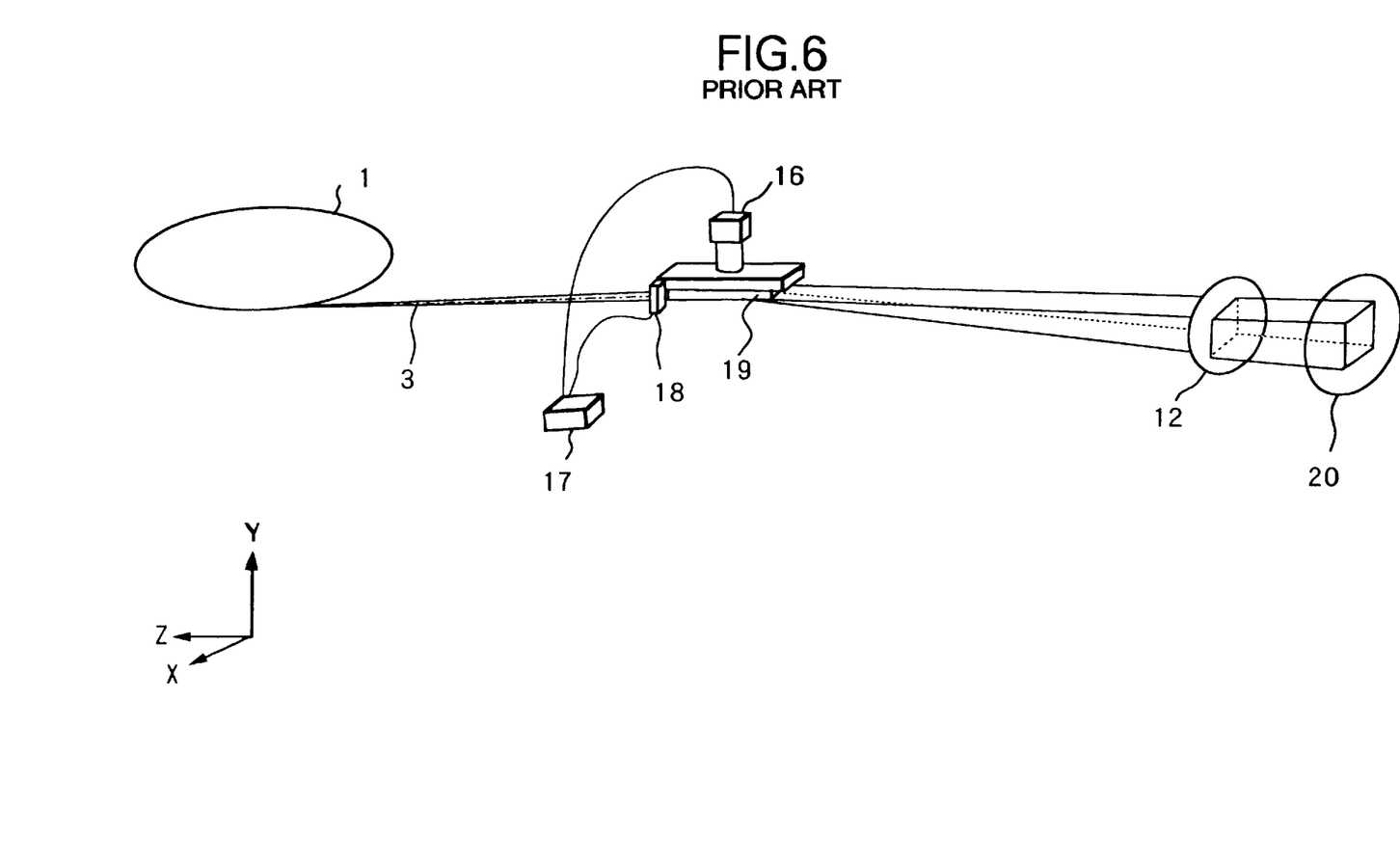
FIG. 6 is a diagram of the configuration of a known x-ray exposing device used in manufacturing semiconductors.

FIG. 6 is a configuration diagram illustrating an example of known x-ray exposing devices used for manufacturing semiconductors. A sheet-like SR light 3 is expanded in the Y direction, so that the SR light is cast upon the entirety of the mask 12. The SR light is not converged with this mirror system, and the light is cast upon the mask without alteration.

Such systems are usually controlled so that the center of the intensity distribution of the SR light in the Y direction is not shifted only in the Y direction as to the reflective surface of the x-ray mirror 19. This is because the intensity of the x-ray cast upon the mask changes greatly due to Y-directional shift between the SR light and the reflective surface of the x-ray mirror.

Specifically, the Y-directional mirror driving means 16 is controlled by the control means 17 according to the output of the SR light position sensor 18 such that the center of the intensity distribution of the SR light in the Y direction is not relatively shifted from a certain position on the reflective surface of the x-ray mirror.

However, with the above known example, it is difficult to keep the relative positional shift between the x-ray and the reflective surface of the x-ray mirror within a certain range at all necessary frequencies, due to the reasons described below.

First, description shall now be made regarding the relation between the amount of shift between the x-ray and the reflective surface of the x-ray mirror, frequency, and fluctuation of intensity distribution.

The following can be listed as causes which generate relative positional shift between the x-ray and the x-ray mirror, thereby causing irregularities in the intensity distribution of the x-ray cast upon the mask.

(1) Change in the emission position or emission direction of the x-ray due to movement of the electron orbit of the SR.
(2) Relative positional change between the light source and the x-ray mirror due to floor vibrations or vibrations in the x-ray illumination device or SR ring due to floor vibrations.
(3) Deformation of the building (floor on which the device is installed) due to temperature changes.

It is understood that a combination of these factors causes relative vibration of the incident x-ray as to the reflecting surface of the x-ray mirror, thereby causing positional offset. The amount of intensity distribution fluctuation due to this positional shifting is determined by the amplitude (amount of positional shifting) thereof and by the vibration frequency. Of the vibration frequency components of the positional shifting, frequency components which are sufficiently high as to the exposure time for one exposure can be ignored, since the intensity distribution fluctuation thereof is averaged out by the vibration occurring multiple times during the exposure period.

On the other hand, regarding changes at frequencies lower than what can be ignored, positional control must be implemented so that the positional shift between the x-ray and the reflective surface of the x-ray mirror is kept within a certain value. Accordingly, the shorter the exposure time is, the higher the control frequency must be.

However, since x-ray mirrors are usually mounted in a super vacuum, a special mechanism is required, such as a driving mechanism capable of operating in such a super vacuum or a driving force from a drive source positioned in the ambient atmosphere by means of metal bellows or the like. In addition, x-ray mirrors tend to be large and heavy. Accordingly, a large-scale driving device is needed to move the mirror at high frequencies and great amplitudes. At even higher frequencies, the vibrations near the natural vibration of the mirror driving device or supporting system such as the frame induced resonance, which makes controlling difficult in some cases. In light of the above, there are limitations to the extent to which even higher precision can be pursued, in the event that only the known method of just controlling the position of the x-ray mirror is employed.

On the other hand, there is a method wherein the electron orbit of the SR is measured, thereby controlling the position of the electron orbit, i.e., the point of emission, according to the measured values, so as to restrict the positional shift between the x-ray and the x-ray mirror. However, the electron orbit is measured by measurement equipment fixed either to or near the SR ring, so this problem cannot be resolved with respect to floor vibrations or deformation of the building. Accordingly, positional control of the electron orbit must be carried out, and, at the same time, floor vibration for the SR ring must be dealt with. In order to deal with the low-frequency floor vibrations, a vibration-reducing mechanism must be provided to the SR ring. However, taking the weight and size of the SR ring into consideration, it is thought that providing a vibration-reducing mechanism for low frequencies to the SR ring is difficult. In addition, it is quite expensive to vibration-proof the entire building for a range that includes low-frequency vibrations. Even in the event that such a vibration-reducing mechanism happened to be installed, it would not be able to deal with extremely slow positional changes such as deformation of the building due to temperature changes.

Consequently, there is an upper limit to the frequencies for controlling the position or attitude of the x-ray mirror, and there is a lower limit to the frequencies wherein control can be executed since the effects of floor vibrations can be felt even if the electron orbit of the SR ring is controlled. Accordingly, it is difficult to restrict the intensity distribution fluctuations due to shift between the x-ray and the x-ray mirror using only one of these two types of control.

SUMMARY OF THE INVENTION

Accordingly, it is an object of the present invention to solve the problems of the known art by providing an x-ray illuminating device wherein the shift of the incident x-rays to the x-ray mirror is greatly reduced, thus enabling x-ray illumination at even higher precision.

It is another object of the present invention to provide an excellent x-ray exposing device and device manufacturing method using the x-ray illuminating device.

That is, according to a first aspect of the present invention, an x-ray illumination device which illuminates an object by reflecting an x-ray irradiated from an emission point with at least one x-ray mirror, comprises: first measuring means for measuring the position of the emission point; first control means for controlling the position of the emission point based on the measurements of the first measuring means; second measuring means for measuring the position of the x-ray near the x-ray mirror; and second control means for controlling the position or the attitude of the x-ray mirror based on the measurements of the second measuring means.

Also, according to a tenth aspect of the present invention, an x-ray exposing device for exposing masks or wafers uses the x-ray illumination device according to the first aspect of the present invention and has means for exposing the masks or wafers.

Also, according to an eleventh aspect of the present invention, an x-ray illumination method for illuminating an object by reflecting an x-ray irradiated from an emission point with at least one x-ray mirror involves controlling the position of the emission point and also controlling the position or the attitude of the x-ray mirror as to the incident x-ray.

Also, according to an thirteenth aspect of the present invention, a device manufacturing method comprises an illuminating step for illuminating masks and wafers, using the x-ray illumination method according to the eleventh aspect of the present invention.

According to a preferred embodiment of the present invention manifesting a second aspect thereof, the control frequency of the first control means of the x-ray illumination device according to the first aspect of the present invention is of a frequency range different from the control frequency of the second control means.

According to another preferred embodiment of the present invention manifesting a third aspect thereof, the control frequency of the first control means of the x-ray illumination device according to the first aspect of the present invention is of a frequency range higher than the control frequency of the second control means.

According to yet another preferred embodiment of the present invention manifesting a fourth aspect thereof, the ranges of the two control frequencies of the first and second control means of the x-ray illumination device according to the third aspect of the present invention partially overlap.

According to still another preferred embodiment of the present invention manifesting a fifth aspect thereof, the x-ray illumination device according to the first aspect of the present invention further comprises an SR ring and has a vibration-reducing mechanism for reducing the transmission of vibrations from the floor.

According to a further preferred embodiment of the present invention manifesting a sixth aspect thereof, the frequency, which the vibration-reducing mechanism in the x-ray illumination device according to the fifth aspect of the present invention reduces, is of a frequency range higher than the control frequency of the second control means.

According to a yet further preferred embodiment of the present invention manifesting a seventh aspect thereof, the first measuring means and the second measuring means of the x-ray illumination device according to the first aspect of the present invention are at least partially shared.

According to a still further preferred embodiment of the present invention manifesting an eighth aspect thereof, the second control means of the x-ray illumination device according to the seventh aspect of the present invention controls the x-ray mirror based on a control frequency range obtained by putting the output of the second measuring means through a low-pass filter to remove high-frequency components not required for control.

According to yet another preferred embodiment of the present invention manifesting a ninth aspect thereof, the x-ray of the x-ray illumination device according to the first aspect of the present invention is synchrotron radiation emitted from an SR radiation source.

According to still another preferred embodiment of the present invention manifesting a twelfth aspect thereof, the control frequency for the position of the emission point of the x-ray illumination method according to the eleventh aspect of the present invention is of a frequency range higher than the control frequency for the x-ray mirror.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Figure 1:
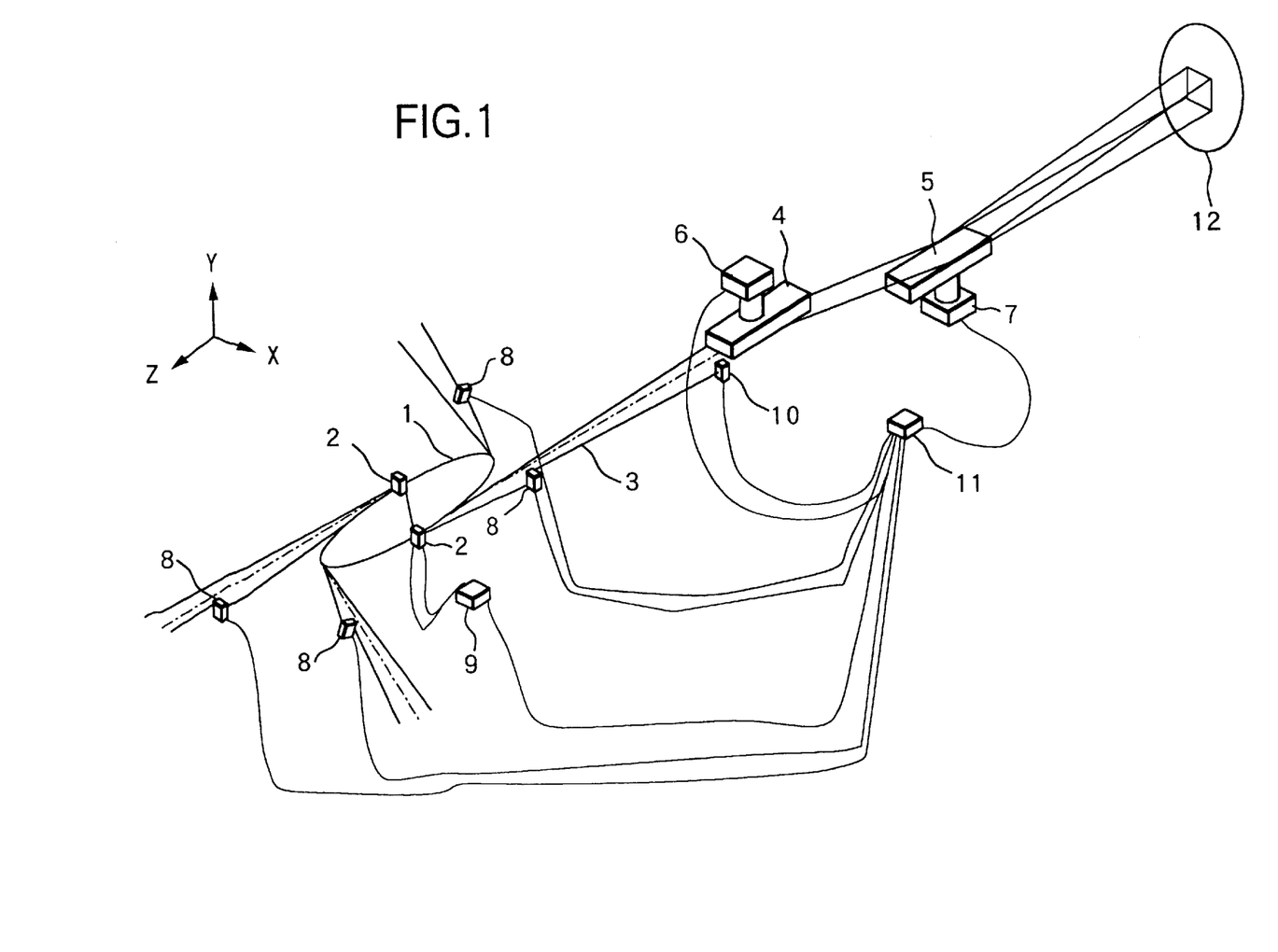
FIG. 1 is a diagram illustrating the configuration of an x-ray illuminating device (x-ray exposing device) according to an embodiment of the present invention.
Figure 2:
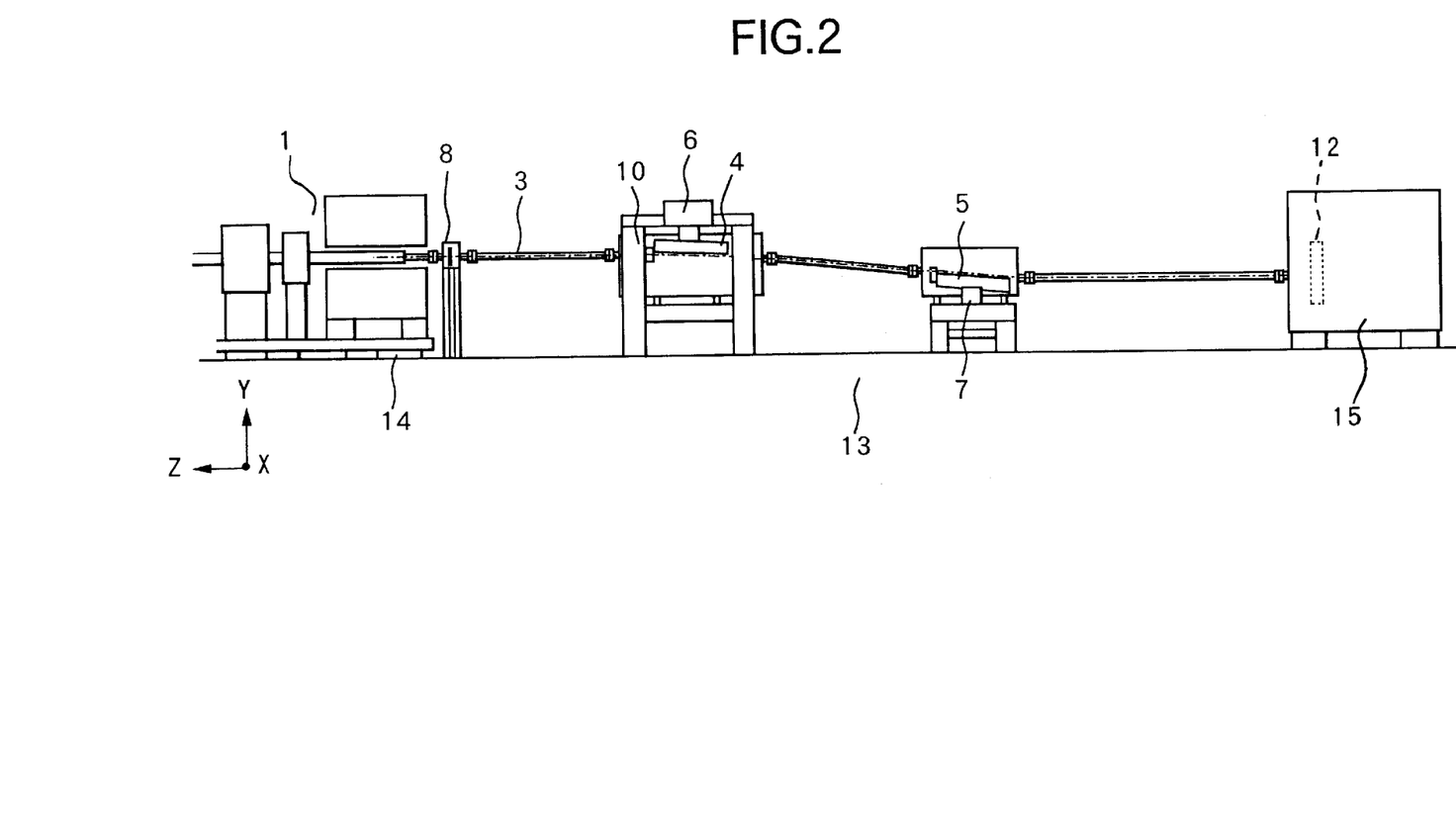
FIG. 2 is a diagram illustrating a floor vibration-reducing device according to an embodiment of the present invention.

FIG. 1 is a diagram illustrating the configuration of an x-ray illuminating device (x-ray exposing device) according to an embodiment of the present invention. Also, FIG. 2 is a diagram illustrating the relation between the SR ring which is the emission source, the x-ray mirror, and the x-ray exposing device.

In FIG. 1, reference numeral 1 denotes the electron orbit within the SR ring, 2 denotes steering magnets for adjusting the position of the electron orbit of the SR, and 3 denotes an x-ray beam which consists of synchrotron radiation emitted from the SR. The x-ray beam is extracted following four beam lines each with differing radiation directions. The following is a description of one beam line. Reference numeral 4 denotes a first x-ray mirror, and reference numeral 5 denotes a second x-ray mirror. Reference numeral 6 denotes a first driving mechanism for adjusting the position and attitude of the first x-ray mirror, and 7 denotes a second driving mechanism for adjusting the position and attitude of the second x-ray mirror.

Reference numeral 8 denotes first SR beam monitors for measuring the position of the x-ray beam immediately after having been emitted from the emission point of the SR ring 1, each being placed immediately behind the x-ray extracting ports for the four beam lines. Reference numeral 9 denotes first control means, for controlling the steering magnets 2 based on the output of the four respective first SR beam monitors 8.

Reference numeral 10 denotes a second SR beam monitor for measuring the position (optical axis) of the incident x-ray near the position of the first x-ray mirror 4. Reference numeral 11 denotes second control means for receiving the output of the first and second beam monitors and passing the output of the first beam monitors to the first control means 9, and also controlling the driving means of the first x-ray mirror and second x-ray mirror based on the output of the second beam monitor. Reference numeral 12 denotes an x-ray mask and wafer serving as the object of irradiation, which are held within the x-ray exposing device.

Also, in FIG. 2, reference numeral 13 denotes the floor on which the SR ring and x-ray mirror are installed, and 14 denotes a vibration-reducing mechanism on which the SR ring 1 is mounted for reducing transmission of vibrations from the floor. Reference numeral 15 denotes an x-ray exposing device. The vibration-reducing mechanism 14 employed has properties such that vibrations greater than a certain frequency are reduced to within a certain range.

With the above configuration, the first control means 9 controls the steering magnets 2 based on the output of the first SR beam monitors 8, so that the emitted x-ray falls within the certain range, thereby controlling the position of the electron orbit. At the same time, the second control means controls the first and second x-ray mirror driving means based on the output of the second SR beam monitor 10, so that the positional relation of the incident x-ray to the first and second x-ray mirrors falls within a certain range, thereby controlling the position and attitude of each x-ray mirror.

Now, the range of control frequencies controlled by the position control of the SR electron orbit 1 and the vibration-reducing mechanism 14 for floor vibrations and the range of control frequencies for controlling the position and attitude of the x-ray mirrors 4 and 5 are determined as follows.

First, a frequency Ns [Nr] and an amplitude "a" are calculated for a supposed shortest single exposure time, the frequency Ns [Nr] being such that the relative positional fluctuation between the x-ray and the x-ray mirror does not affect irregularity in intensity at that frequency or at higher frequencies. With the supposed shortest single exposure time as $T_{ex}$ and the amount of shift which generates 1% in irregularity of intensity on the exposure surface as "er", the irregularity E generated in the event that shifting between the frequency N and the amplitude "a" occurs can be expressed as follows:

$$E = ((er \times a)/\sqrt{2})/(N \times T_{ex})$$

Based on the above expression, the maximum frequency Ns whereby the x-ray and the surface of the x-ray mirror are to be positioned is calculated. Ns can be inversely calculated from the above expression, by determining the acceptable margin of error of "irregularity in intensity" for positioning.

Next, the frequency at which vibrations at the mirror position can be restricted to a certain amplitude by means of controlling the SR electron orbit and by suppressing floor vibrations, i.e., the maximum frequency Nr at which the x-ray mirror can follow the relative positional change of the x-ray is calculated. This frequency is either the highest portion of the low-frequency component which cannot be removed by electron orbit control or the cut-off frequency of the vibration-reducing mechanism for reducing floor vibrations, whichever is higher. Nr is determined from the amplitude and frequency thereof, the natural vibration frequency of the stage system, and the weight of the mirror and mirror supporting system. Nr can also be obtained by actually controlling the SR orbit and controlling floor vibrations, then measuring the relative positional shift at the position of the x-ray mirror.

Incidentally, a low-pass filter for cutting out frequencies higher than the frequency Nr is provided to the output of the second SR beam monitor for controlling the position of the x-ray mirror. Thus, the position control of the x-ray mirror is controlled within the range of the frequency Nr or lower. That is, by means of providing a low-pass filter to the output of the second SR beam monitor, the x-ray mirror is not controlled at frequencies higher than necessary, thereby reducing the output of the driving device and enabling reduction of electrical power consumption.

Figure 3:
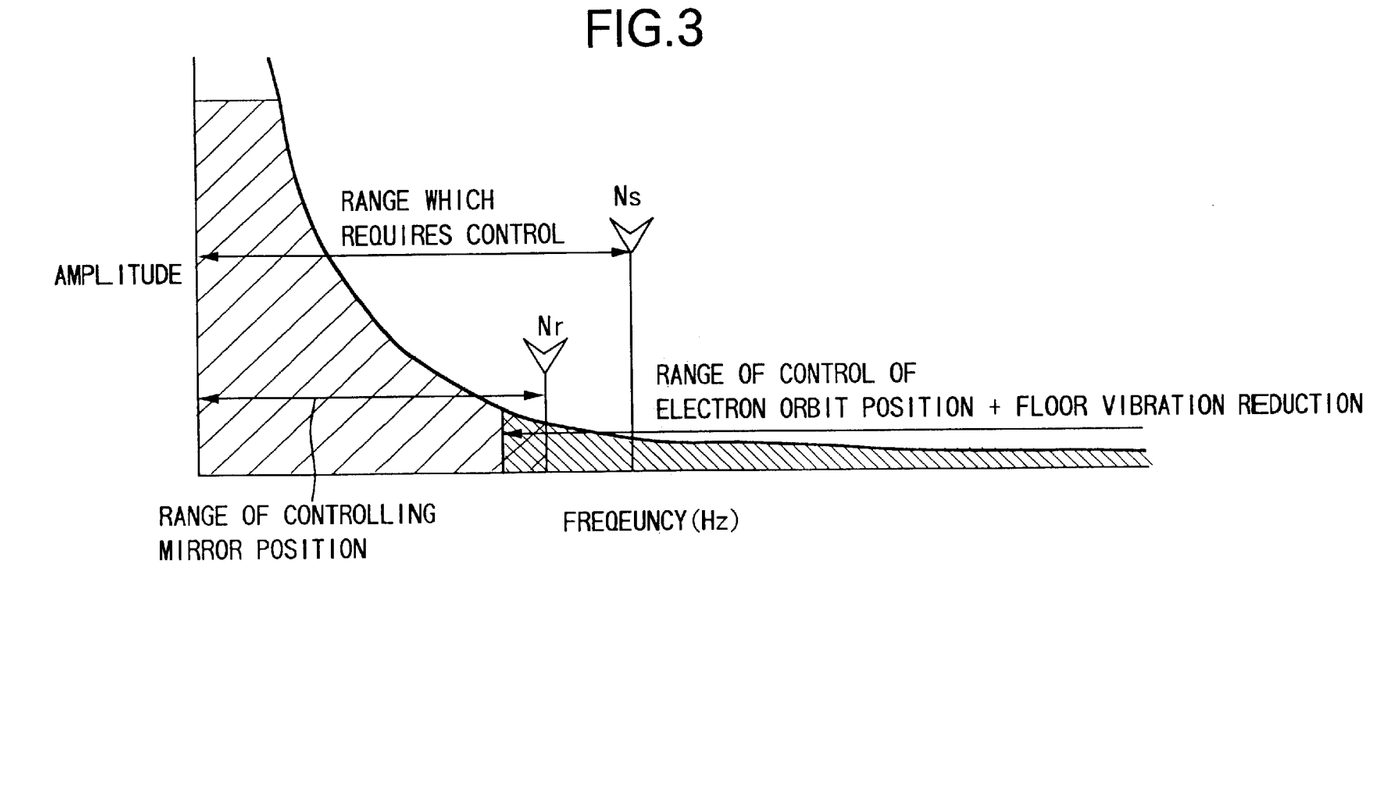
FIG. 3 is a diagram illustrating the relation between the distribution range of controllable frequencies and amplitude.

FIG. 3 shows the relation between the range of frequency which can be controlled and amplitude, based on the two maximum frequencies (Ns and Nr) described above. As can be understood from the drawing, the control ranges of each means are set so as to partially overlap. Also, while the frequency range according to the combination of electron orbit position control and floor vibration reduction partially overlaps, the frequency range thereof is higher than the above-described frequencies Ns and Nr.

As described above, the following advantages can be obtained by means of setting the frequency ranges controlled by the SR ring electron orbit position controlling means and the floor vibration removing mechanism, which comprise the x-ray illuminating device.

First, by controlling the SR electron orbit and floor vibration, the need to have high control frequencies for the means for controlling the position and attitude of the x-ray mirror is done away with due to the fact that the positional shifting of the x-ray and x-ray mirror reflecting surface can be kept within a certain range at high frequency portions, thereby realizing an inexpensive x-ray mirror system.

Second, by controlling the position and attitude of the x-ray mirror, the positional shifting of the x-ray and x-ray mirror reflecting surface can be kept within a certain range at low frequency portions, so there is no need to lower the vibration-reducing frequency for the SR ring, and there is no need to provide a large-scale vibration-reducing mechanism. Also, in the event that the control frequency of the means for controlling the position and attitude of the x-ray mirror can be handled to around 4 to 50 Hz, there is no need to provide a vibration-reducing mechanism for the SR ring, and a vibration-reducing mechanism may be provided to a vibration source which produces frequencies greater than the controllable frequencies.

While the above description has been made with respect to the Y direction in which effects are greatest, it is desirable to perform control in other directions as well, i.e., the X direction, Y direction, and for rotational vibrations.

Also, while the present example describes as a preferred embodiment an arrangement in which both the first and second x-ray mirrors are driven and repositioned, advantages can be obtained by driving at least one mirror.

Also, while the present example describes an arrangement in which the first measuring means for measuring the position of the emitting point and the second measuring means for measuring the x-ray position near the x-ray mirror as two separate measurement means, either one of the measuring means may serve as both.

Also, the present invention is by no means restricted to the single-exposure method wherein the SR beam is enlarged in the vertical direction; rather, the present invention may be equally applied to methods wherein a sheet-shaped SR beam is relatively scanned to a mask so as to perform exposing.

Also, while the present example describes an arrangement in which a vibration-reducing mechanism is provided on the floor on which the SR ring and x-ray mirror are to be placed, the same advantages can be obtained by not placing vibration sources which generate vibrations greater than a certain frequency on the floor.

Embodiment of Application to a Device Manufacturing Method

Figure 4:
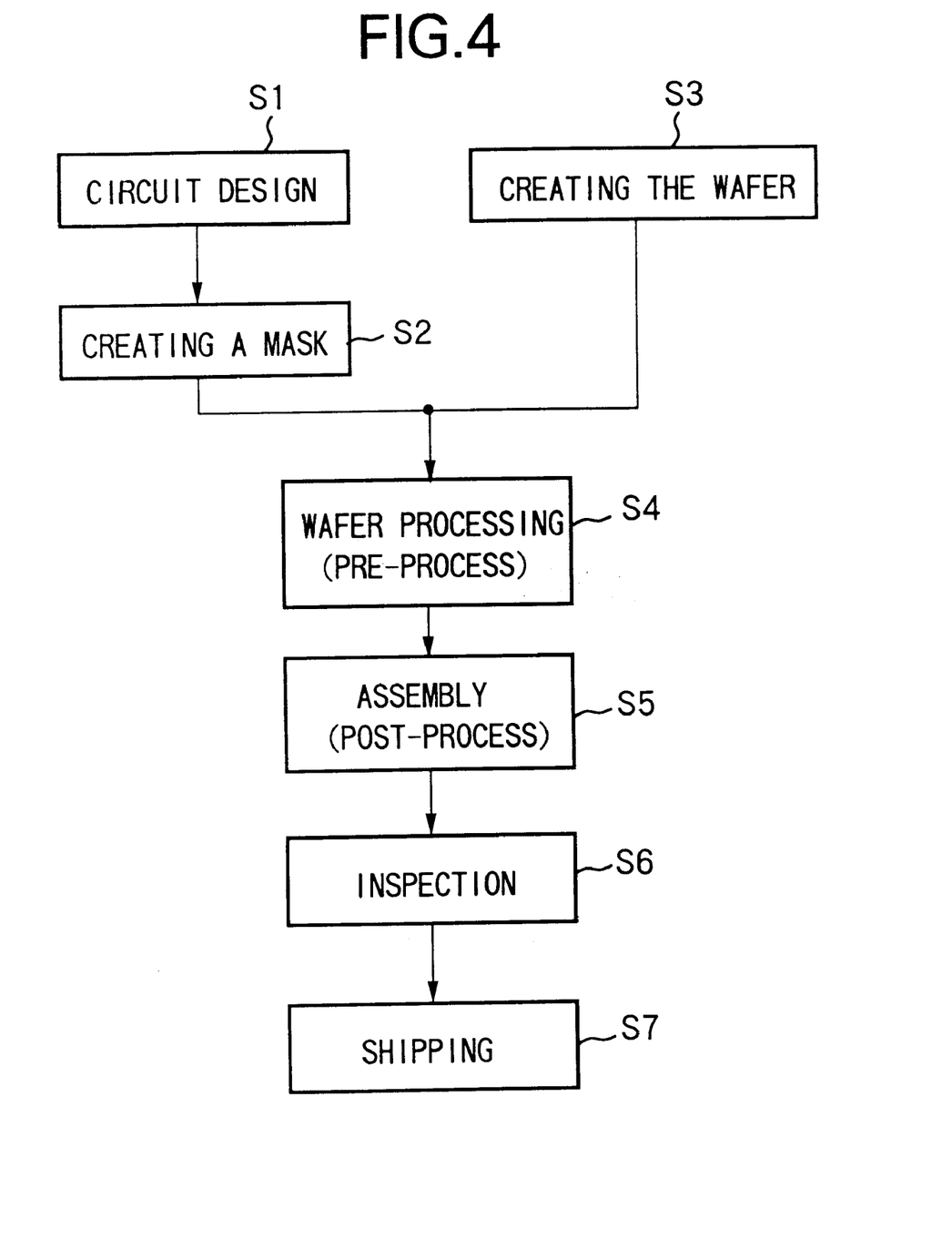
FIG. 4 is a diagram illustrating the flow of a method for manufacturing semiconductor devices.

Next, description shall be made regarding an embodiment of a device manufacturing method using the x-ray exposing device described above. FIG. 4 shows a flowchart for manufacturing a minute device (semiconductor chips such as ICs or LSIs, liquid crystal panels, CCDS, thin-film magnetic heads, micro-machines, etc.). In Step 1 (circuit design), circuit design of the semiconductor device is performed. In Step 2 (creating a mask), a mask is manufactured with the form of the designed pattern. On the other hand, in Step 3 (creating the wafer), the wafer is manufactured using materials such as silicon or glass. In Step 4 (wafer processing), which is a preprocess, the mask and wafer prepared above are used, and the actual circuit is formed on the wafer using lithography technology. The following step 5 (assembly) which is a post-process, is a process for making a semiconductor chip of the wafer manufactured in Step 4 and includes steps such as assembly (dicing, bonding) and packaging (sealing the chip). Step 6 (inspection) is a process for performing operation testing of the semiconductor device, endurance testing, and so forth. The semiconductor device is thus completed by these steps and is hence shipped (Step 7).

Figure 5:
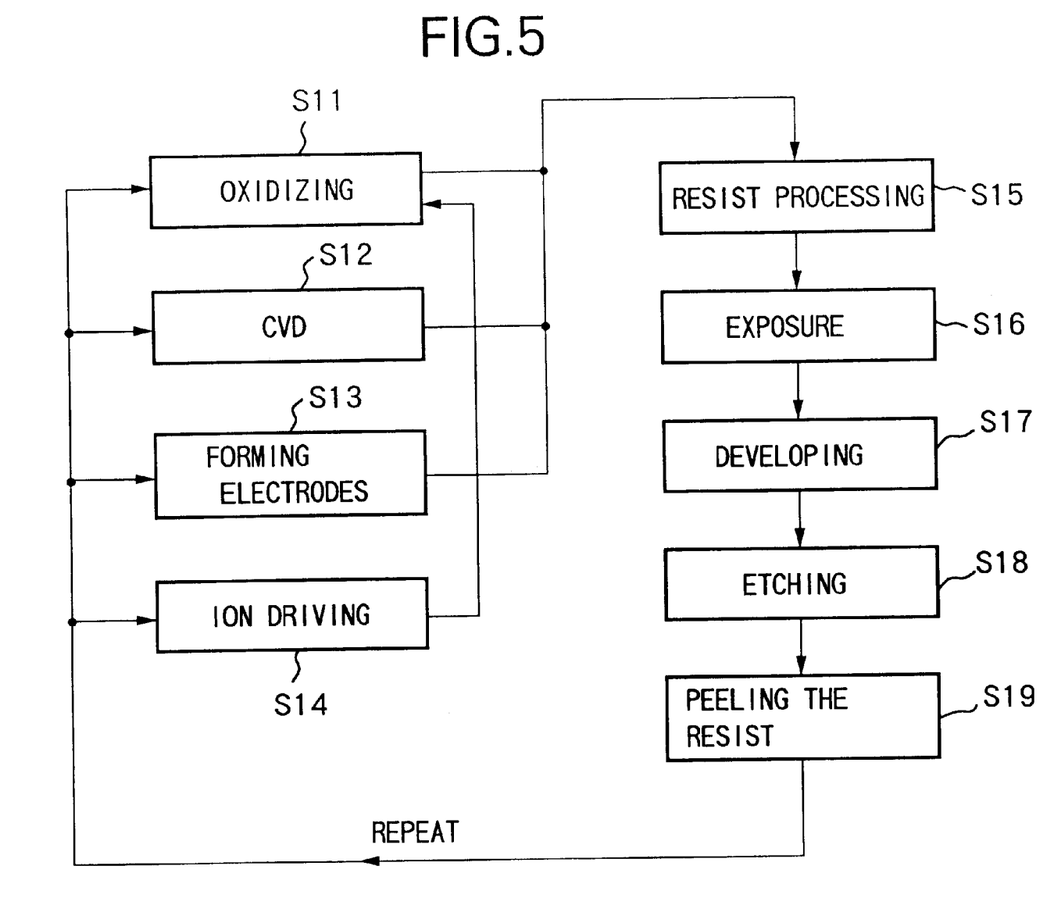
FIG. 5 is a diagram illustrating a detailed flow for the wafer process.

FIG. 5 is a detailed flowchart of the above wafer processing. Step 11 (oxidizing) is a step for oxidizing the surface of the wafer. In Step 12 (CVD), an insulating film is formed on the surface of the wafer. In Step 13 (forming electrodes), electrodes are formed on the wafer by vapor deposition. In Step 14 (ion driving), ions are driven into the wafer. In Step 15 (resist processing), resist is applied to the wafer. In Step 16 (exposure), the circuit pattern on the mask is burnt onto the wafer by the exposing device or exposing method described above. In Step 17 (developing), the exposed wafer is developed. In Step 18 (etching), portions other than the developed resist are etched away. In Step 19 (peeling the resist), the resist which has become unnecessary because of completion of the etching is removed. Repeating these steps forms a plurality of layers of circuit patterns on the wafer.

The manufacturing method of the present embodiment realizes highly precise devices at a low cost, which has been difficult until now.

The present invention is not limited to the above embodiment and various changes and modifications can be made within the spirit and scope of the present invention. Therefore, to appraise the public of the scope of the present invention, the following claims are made.

What is claimed is:

1. An x-ray illumination device which illuminates an object by reflecting an x-ray irradiated from an emission point with at least one x-ray mirror, said x-ray illumination device comprising:

first measuring means for measuring the position of said emission point;

first control means for controlling the position of said emission point based on the measurements of said first measuring means;

second measuring means for measuring the position of the x-ray near said x-ray mirror; and second control means for controlling the position or the attitude of said x-ray mirror based on the measurements of said second measuring means.

2. The x-ray illumination device according to claim 1, wherein the control frequency of said first control means is of a frequency range different to the control frequency of said second control means.

3. The x-ray illumination device according to claim 2, wherein the control frequency of said first control means is of a frequency range higher than the control frequency of said second control means.

4. The x-ray illumination device according to claim 3, wherein the ranges of the two control frequencies of said first and second control means partially overlap.

5. The x-ray illumination device according to claim 1, further comprising an SR ring and having a vibration-reducing mechanism for reducing the transmission of vibrations from the floor.

6. The x-ray illumination device according to claim 5, wherein the frequency which said vibration-reducing mechanism reduces is of a frequency range higher than the control frequency of said second control means.

7. The x-ray illumination device according to claim 1, wherein said first measuring means and said second measuring means are at least partially shared.

8. The x-ray illumination device according to claim 7, wherein said second control means controls said x-ray mirror based on a control frequency range obtained by putting the output of said second measuring means through a low-pass filter to remove high-frequency components unnecessary for control.

9. The x-ray illumination device according to claim 1, wherein said x-ray is synchrotron radiation emitted from an SR radiation source.

10. An x-ray exposing device for exposing masks or wafers using the x-ray illumination device according to claim 1 and having means for exposing said masks or wafers.

11. An x-ray illumination method for illuminating an object by reflecting an x-ray irradiated from an emission point with at least one x-ray mirror;

wherein said x-ray illumination method controls the position of said emission point and also controls the position or the attitude of said x-ray mirror as to the incident x-ray.

12. The x-ray illumination method according to claim 11, wherein the control frequency for the position of the emission point is of a frequency range higher than the control frequency for said x-ray mirror.

13. A device manufacturing method comprising the step of illuminating masks and wafers using the x-ray illumination method according to claim 11.

* * * * *

UNITED STATES PATENT AND TRADEMARK OFFICE
CERTIFICATE OF CORRECTION

PATENT NO. : 6,256,371 B1
DATED : July 3, 2001
INVENTOR(S) : Takayuki Hasegawa et al.

It is certified that error appears in the above-identified patent and that said Letters Patent is hereby corrected as shown below:

<u>Title page,</u>
Item [57] ABSTRACT,
Line 12, "here" should be deleted.

<u>Column 2,</u>
Line 17, "induced" should read -- induce --.

<u>Column 6,</u>
Line 45, "Y direction," should read -- Z direction, --.

<u>Column 7,</u>
Line 7, "CCDS," should read -- CCDs, --;
Line 14, "preprocess," should read -- pre-process, --;
Line 16, "step" should read -- Step --; and
Line 45, "appraise" should read -- apprise --.

<u>Column 8,</u>
Line 8, "to" should read -- from --.

Signed and Sealed this

Twenty-sixth Day of February, 2002

Attest:

JAMES E. ROGAN
Attesting Officer    Director of the United States Patent and Trademark Office